(12) United States Patent
Iida et al.

(10) Patent No.: US 8,153,908 B2
(45) Date of Patent: Apr. 10, 2012

(54) CIRCUIT BOARD AND METHOD OF PRODUCING THE SAME

(75) Inventors: Kenji Iida, Kawasaki (JP); Tomoyuki Abe, Kawasaki (JP); Yasutomo Maehara, Kawasaki (JP); Shin Hirano, Kawasaki (JP); Takashi Nakagawa, Kawasaki (JP); Hideaki Yoshimura, Kawasaki (JP); Seigo Yamawaki, Kawasaki (JP); Norikazu Ozaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 899 days.

(21) Appl. No.: 12/173,371

(22) Filed: Jul. 15, 2008

(65) Prior Publication Data

US 2009/0095511 A1 Apr. 16, 2009

(30) Foreign Application Priority Data

Oct. 12, 2007 (JP) ................................ 2007-267206

(51) Int. Cl.
*H05K 1/11* (2006.01)
*H05K 1/03* (2006.01)
(52) U.S. Cl. .................... 174/262; 174/255; 174/256
(58) Field of Classification Search .................... None
See application file for complete search history.

(56) References Cited

U.S. PATENT DOCUMENTS

| 7,200,927 | B2 * | 4/2007 | Higashitani | 29/847 |
| 7,385,146 | B2 * | 6/2008 | Asai et al. | 174/262 |
| 7,514,779 | B2 * | 4/2009 | Hirose et al. | 257/700 |
| 7,624,501 | B2 * | 12/2009 | Machida | 29/846 |
| 7,691,189 | B2 * | 4/2010 | En et al. | 106/1.23 |
| 7,916,492 | B1 * | 3/2011 | Zhong et al. | 361/760 |
| 2009/0314526 | A1 * | 12/2009 | Nagasawa et al. | 174/255 |

FOREIGN PATENT DOCUMENTS

| JP | 07-221460 | 8/1995 |
| JP | 2001-203458 | 7/2001 |
| JP | 2004-87856 | 3/2004 |
| JP | 2004-119691 | 4/2004 |
| JP | 2006-32872 | 2/2006 |
| JP | 2006-222216 | 8/2006 |
| KR | 10-2004-0027326 | 4/2004 |
| WO | 2004/064467 A1 | 7/2004 |

OTHER PUBLICATIONS

Korean Office Action issued Jun. 8, 2010 in corresponding Korean Patent Application 10-2008-0076951.
Japanese Notice of Rejection mailed Dec. 13, 2011 issued in corresponding Japanese Patent Application No. 2007-267206.

* cited by examiner

*Primary Examiner* — Boris Chervinsky
(74) *Attorney, Agent, or Firm* — Staas & Halsey LLP

(57) ABSTRACT

The circuit board is capable of tightly bonding a cable layer on a base member even if thermal expansion coefficients of the base member and the cable layer are significantly different. The circuit board comprises: the base member; and the cable layer being laminated on the base member with anchor patterns, which are electrically conductive layers formed on a surface of the base member.

6 Claims, 8 Drawing Sheets

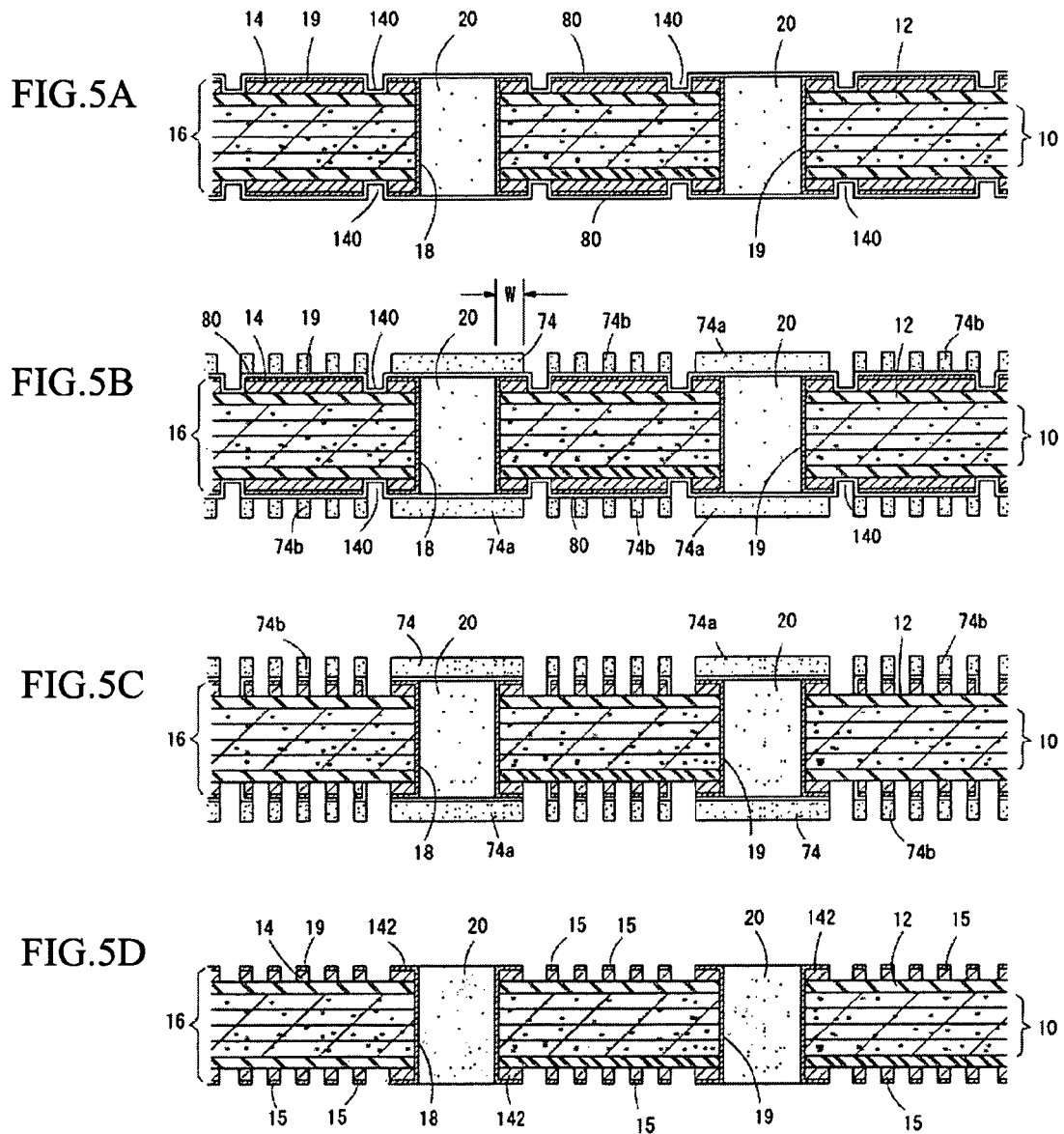

CIRCUIT BOARD AND METHOD OF PRODUCING THE SAME

BACKGROUND OF THE INVENTION

The present invention relates to a circuit board and a method of producing the circuit board, more precisely relates to a circuit board, in which a base member and a cable layer have different thermal expansion coefficients, and a method of producing the circuit board.

Some test substrates, which are used for testing circuit boards, on which semiconductor elements will be mounted, and semiconductor wafers, include core substrates composed of carbon fiber-reinforced plastic (CFRP). In comparison with conventional glass-epoxy core substrates, thermal expansion coefficients of the core substrates composed of carbon fiber-reinforced plastic are small, and thermal expansion coefficients of the circuit boards having such core substrates can be corresponded to those of semiconductor elements to be mounted on the circuit boards. Therefore, thermal stress generated between a semiconductor element and a circuit board can be effectively avoided.

The circuit board is formed by laminating cable layers on the both side faces of the core substrate, and plated through-hole (PTH) sections are formed in the core substrate so as to mutually electrically connect the cable layers on the both side faces thereof. The plated through-hole sections are formed by boring through-holes in a substrate and forming plated layers (electrically conductive parts) on inner faces of the through-holes.

In case of the base member having the electrically conductive core section composed of, for example, carbon fiber-reinforced plastic, if the plated through-hole sections are formed by merely boring the through-holes and plating the inner faces thereof, the plated through-hole sections and the core section are electrically shorted. Thus, the plated through-hole sections are formed in the core substrate having the electrically conductive core section by the steps of: forming pilot holes, whose diameters are greater than those of the plated through-hole sections to be formed, in the base member; filling the pilot holes with insulating resin; and forming the plated through-hole sections in the filled through-holes. With this method, the plated through-hole sections and the core section are not electrically shorted (see JP Kohyo Gazette No. 2004/064467, JP Patent Gazette No. 2006-222216).

However, if the pilot holes are drilled, burrs are formed on inner faces of the pilot holes and the plated through-hole sections and the core section will be electrically shorted. To solve this problem, the inner faces of the pilot holes are coated with insulating layers so as not to electrically short the plated through-holes and the core section (see JP Patent Gazette No. 2006-222216). However, it is difficult to perfectly coat the rough inner faces of the pilot holes.

The core substrate is formed by laminating cable layers on the both side faces of a core section. If the core section is composed of a material having a small thermal expansion coefficient, e.g., carbon fiber-reinforced plastic, great heat stresses work to boundary faces between the core section and the cable layers because the thermal expansion coefficients of the cable layers are much greater than that of the core section (e.g., 13-30 ppm/° C.). By the great heat stresses, the cable layers will be separated from the core section or cracks will be formed therebetween. To avoid the problem, bonding strength between the core section and the cable layers must be increased. The problem of the heat stresses between the core section and the cable layers will occur in not only substrates having electrically conductive core sections but also generic substrates.

SUMMARY OF THE INVENTION

The present invention was conceived to solve the above described problems.

An object of the present invention is to provide a highly reliable circuit board, which is capable of tightly bonding a cable layer on a base member even if thermal expansion coefficients of the two are significantly different.

Another object is to provide a method of producing the circuit board of the present invention.

To achieve the objects, the present invention has following constitutions.

Namely, the circuit board of the present invention comprises: a base member; and a cable layer being laminated on the base member with anchor patterns, which are electrically conductive layers formed on a surface of the base member.

The anchor patterns may be a number of bosses projected from the surface of the base member, thereby the cable layer can be tightly bonded on the base member by their anchoring functions.

The circuit board may be a core substrate having a plated through-hole section, which penetrates the base member and the cable layer in the thickness direction.

In the circuit board, the base member may have an electrically conductive core section; and a pilot hole for forming the plated through-hole section may be formed in the core section.

In the circuit board, an inner face of the pilot hole may be coated with a plated layer; and the pilot hole may be filled with an insulating material, thereby short circuit between the conductive core section and the plated through-hole section can be prevented. Further, the inner face of the pilot hole may be further coated with an insulating film formed on the plated layer, thereby the short circuit between the conductive core section and the plated through-hole section can be securely prevented.

Successively, the method of the present invention comprises the steps of: coating a surface of a base member with an electrically conductive layer; pattern-etching the conductive layer so as to form anchor patterns, which are a number of bosses projecting from the surface of the base member; and laminating a cable layer on the anchor patterns.

In the method, the cable layer may be integrated with the base member, in said laminating step, by heating and pressurizing a cable sheet on the base member together with a prepreg, thereby the cable layer can be easily integrally laminated on the base member.

The method may further comprise the step of forming a plated through-hole section, wherein a through-hole is formed in the base member, on which the cable layer has been laminated, and an inner face of the through-hole is plated, thereby a core substrate having the plated through-hole section can be produced.

In the method, cable layers may be further laminated on the base member, in which the plated through-hole section has been formed, as a multi-layered circuit board.

In the method, the base member may have an electrically conductive core section; a pilot hole for forming a plated through-hole section may be formed in the core section; and the base member, in which the pilot hole has been formed, may be plated so as to coat an inner face of the pilot hole with a plated layer and coat the surface of the base member with the conductive layer, thereby the short circuit between the conductive core section and the plated through-hole section can be securely prevented.

In the method, the inner face of the pilot hole, which has been coated with the plated layer, may be further coated with an insulating film by an electrodeposition method, in which the plated layer is used as an electric power feeding layer, thereby the short circuit between the conductive core section and the plated through-hole section can be further securely prevented.

In the method, the pilot hole may be filled with an insulating material after coating the inner face of the pilot hole with the plated layer; and the conductive layer formed on the surface of the base member may be patterned in a prescribed pattern so as to form anchor patterns.

In the method, the pilot hole, whose inner face has been coated with the insulating film, may be filled with an insulating material; an end face of the insulating material filling the pilot hole may be abraded; the conductive layer may be exposed on the surface of the base member by abrading and removing the insulating film formed on the surface of the base member; and the conductive layer may be patterned in a prescribed pattern so as to form anchor patterns.

In the method, the conductive layer may be left along an edge of the pilot hole as a land when the conductive layer is etched to form the anchor patterns.

In the circuit board and the method of the present invention, the anchor patterns are formed on the surface of the base member, and then the cable layer is laminated on the anchor patterns, so that the cable layer can be tightly bonded on the base member by anchoring functions of the anchor patterns. Therefore, even if thermal expansion coefficients of the base member and the cable layer are significantly different, separating the cable layer from the base member and forming a crack therebetween can be prevented.

BRIEF DESCRIPTION OF THE DRAWINGS

Embodiments of the present invention will now be described by way of examples and with reference to the accompanying drawings, in which:

FIGS. 5A-5D are partial sectional views showing the steps of etching conductive layers formed on the both side faces of the base member and forming anchor patterns thereon;

DETAILED DESCRIPTION OF THE EMBODIMENTS

Preferred embodiments of the present invention will now be described in detail with reference to the accompanying drawings.

(Steps of Forming Core Substrate)

In the following description, a method of producing a core substrate, which has an electrically conductive core section, will be explained as embodiments of the present invention.

FIGS. 1A-2B show the steps of: forming pilot holes, through which plated through-hole sections will be respectively pierced, in a base member; forming gas purging holes; and filling the pilot holes with insulating materials.

Figure 1A:
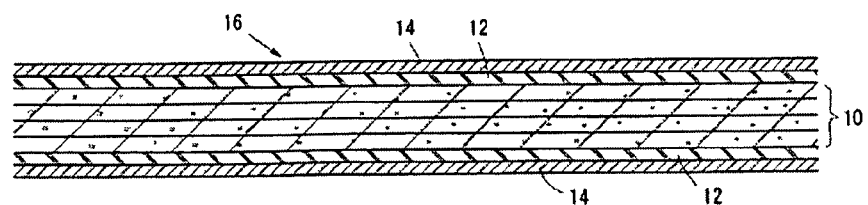
FIGS. 1A-1D are partial sectional views showing the steps of forming pilot holes and gas purging holes in a base member.

FIG. 1A shows a flat plate-shaped base member 16, which comprises a core section 10 composed of carbon fiber-reinforced plastic and copper foils 14 respectively bonded on the both side faces of the core section 10 with prepregs 12. The core section 10 is formed by the steps of: laminating four prepregs, each of which is formed by impregnating a carbon cloth with polymer, e.g., epoxy resin; and heating and pressurizing the laminated prepregs so as to integrate them. Note that, number of the laminated prepregs including carbon fibers, which constitute the core section 10, can be optionally selected.

In the present embodiment, the core section 10 is constituted by woven carbon fiber cloths, each of which is composed of carbon fiber filaments. Further, unwoven carbon fiber cloths, carbon fiber meshes, etc. may be used instead of the woven carbon fiber cloth. Thermal expansion coefficients of carbon fibers are about 0 ppm/° C., and a thermal expansion coefficient of the core section 10 can be adjusted by selecting: a rate of content of carbon fibers in the carbon fiber-reinforced plastic; resin materials included in the carbon fibers; fillers mixed with the resin, etc. In the present embodiment, the thermal expansion coefficients of the core section 10 is about 1 ppm/° C.

A thermal expansion coefficient of the entire base member having the core section 10 composed of the carbon fiber-reinforced plastic can be adjusted by selecting thermal expansion coefficients of cable layers, which constitute the base member, and insulating layers, which are provided between the cable layers. Further, a thermal expansion coefficient of a circuit board, which is formed by laminating build-up layers on the both side faces of the base member, can be properly adjusted by selecting thermal expansion coefficients of the base member and the build-up layers. Thermal expansion coefficients of semiconductor elements are about 3.5 ppm/° C. Thermal expansion coefficients of the circuit board can be easily corresponded to that of semiconductor elements to be mounted on the circuit board.

Figure 1B:
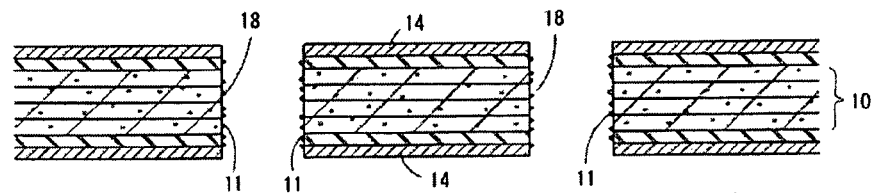
Figure 1C:
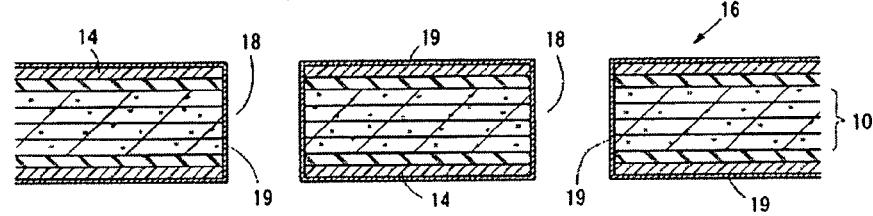

In FIG. 1B, pilot holes 18 are bored in the base member 16. The pilot holes 18 are through-holes, which are bored in the thickness direction of the base member 16 by a drill. Diameters of the pilot holes are greater than those of through-holes of plated through-hole sections, which will be formed in the following step. In the present embodiment, the diameters of the pilot holes 18 are 0.8 mm; the diameters of the through-holes of the plated through-hole sections are 0.35 mm. The pilot holes 18 are located at prescribed planar positions, which correspond to the plated through-hole sections to be formed in the base member.

When the pilot holes 18 are drilled, burrs are formed on inner faces of the pilot holes 18 due to, for example, abrasion of the drill, and the pilot holes 18 have rough or uneven inner faces. Further, drill dusts of the core section 10 will stick on the inner faces of the pilot holes 18.

In case of the core section 10 composed of carbon fiber-reinforced plastic, carbon dusts 11 stick on the inner faces of the pilot holes 18. The carbon dusts 11 have electric conductivity, so if the carbon dusts 11 invade into resin 20 filling the pilot holes 18, the insulation performance of the resin 20 is worsened. Further, the plated through-hole section and the core section 10 will be electrically shorted.

To prevent the short circuit between the plated through-hole sections and the core section 10, in the present embodiment, electroless copper plating and electrolytic copper plating are performed in this order after forming the pilot holes 18 in the base member 16 so as to coat the inner faces of the pilot holes 18 with copper plated layers 19. By electroless-plating the base member 16 with copper, the copper layer is formed on the entire inner faces of the pilot holes 18 and the entire side faces of the base member 16. Then, the electrolytic plating is performed with using the copper layer as an electric power feeding layer, so that the plated layers 19 can be formed on the inner faces of the pilot holes 18 and the both side faces of the base member 16 (see FIG. 1C). A thickness of the copper layer formed by the electroless plating is about 0.5 μm; thicknesses of the plated layers 19 formed by the electrolytic plating are about 10-20 μm.

By coating the inner faces of the pilot holes 18, the inner faces of the pilot holes 18 are made smooth, so that the pilot holes 18 can be easily filled with the resin 20 without forming voids. Therefore, the plated through-hole sections 20 and the core section 10 are not shorted at positions corresponding to voids. Further, the dusts 11 stuck on the inner faces of the pilot holes 18 are encompassed by or embedded in the plated layers 19, so that no dusts 11 are peeled from the inner faces thereof. With this structure, insulating performance of the resin 20 can be secured.

In the step of filling the pilot holes 18 with the resin 20, a heat treatment is performed so as to cure the resin 20, so a decomposition gas is generated from a plastic component of the core section 10 or moisture absorbed in the core section 10 is vaporized.

The decomposition gas and the water vapor, which are generated during the heat-curing step, move to exit from the core section 10, but the plated layers 19 coat the entire surfaces of the core section including the inner faces of the pilot holes 18. With this structure, the gas and the water vapor cannot exit therefrom, thus they expand the plated layers 19 coating the inner faces of the pilot holes and the copper foils 14 and the plated layers 19 coating the side faces of the base member 16. A purpose of forming the plated layer 19 is to coat the inner faces of the pilot holes 18 and make them smooth. If the plated layers 19 are expanded, the purpose cannot be achieved.

The structure of entirely coating the surfaces of the base member 16 including the inner faces of the pilot holes 18 with the plated layers 19 and the copper foils 14 causes the above described problem when the step of heat-curing the resin 20 in the pilot holes 18 is performed. Further, the structure causes the same problem when cable layers are formed on the both side faces of the base member 16 by heating and pressurizing cable sheets with prepregs.

In case of producing a circuit board by forming build-up layers on the both side faces of the base member 16, the process of forming the build-up layers includes heating steps, so the problem of expanding the copper foils 14 and the plated layers 19, which is caused by the gas generated from the core section 10 or the base member 16, will occur.

Thus, in the method of the present embodiment, gas purging holes 140 are formed in the surfaces of the base member 16 so as to securely form paths for discharging or purging the decomposition gas generated from the core section 10 and/or water vapor generated from the base member 16.

Figure 1D:
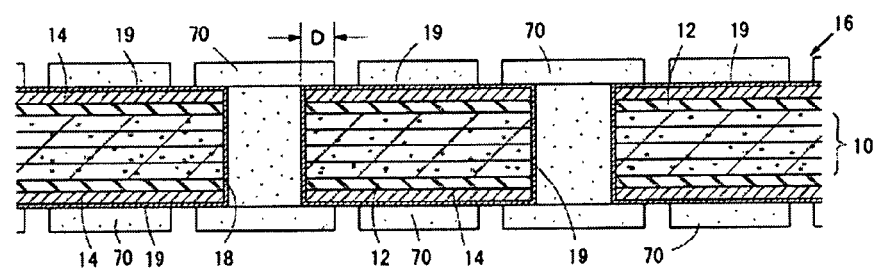

In FIG. 1D, dry film resist (photo resist) is applied on the both side faces of the base member 16, and then the photo resist is patterned to form resist patterns 70, in which parts corresponding to the gas purging holes 140 to be formed are exposed, by optically exposing and developing the photo resist, so as to form the gas purging holes 140 in the both side faces of the resist 16.

By forming the gas purging holes 140, the copper foils 14 coating the side faces of the base member 16 and the plated layers 19 laminating on the copper foils 14 are partially bored, so that the surfaces of the prepregs 12 coating the core section 10 are exposed so as to communicate the core section 10 to the outside.

Positions and sizes of the gas purging holes 14 may be optionally selected. In the present embodiment, the gas purging holes 140 are located near the pilot holes 18 so as to prevent expansion of the plated layers 19 on the inner faces of the pilot holes 18.

In the present embodiment, a separation D between the gas purging hole 10 and the edge of the pilot hole 18 is 300-350 μm. When the gas purging holes 140 are formed, amount of etching side faces of the gas purging holes 140 depends on thicknesses of the plated layers 19 and the copper foils 14, etching conditions, e.g., etching solution, etc. Therefore, the positions of the gas purging holes 140 may be designed on the basis of the amount of etching the side faces of the gas purging holes 140.

Etching the side faces is caused, by invasion of the etching solution, when the copper foils 14 and the plated layers 19 on the surfaces of the base member 16 are etched with using the resist patterns 70 as the masks, and the amount of etching the side face is varied by etching conditions, e.g., thicknesses of the copper foils 14 and the plated layers 19, etching solution, injecting pressure of the etching solution. When the resist patterns are designed, the distance D may be set so as to prevent the etching solution from reaching the inner faces of the pilot holes 18.

Figure 2A:
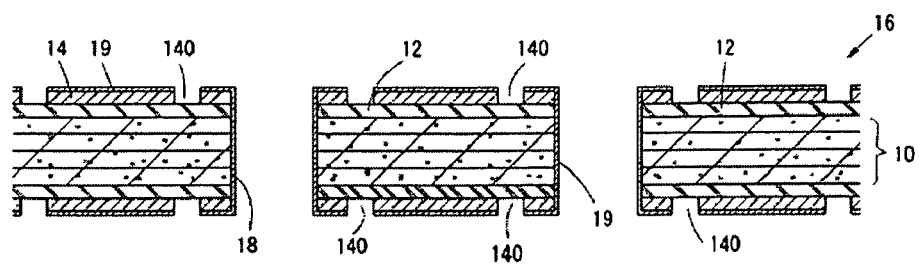
FIGS. 2A and 2B are partial sectional views showing the steps of forming the gas purging holes and filling the pilot holes with resin.

In FIG. 2A, the gas purging holes 140 are formed by etching the plated layers 19 and the copper foils 14 with using the resist patterns 70 as masks. The surfaces of the prepregs 12 are exposed in the gas purging holes 140, and the core section 10 is communicated to the outside of the base member 16 via the gas purging holes 140 so that the core section 10 is communicated to the outside.

Figure 3:
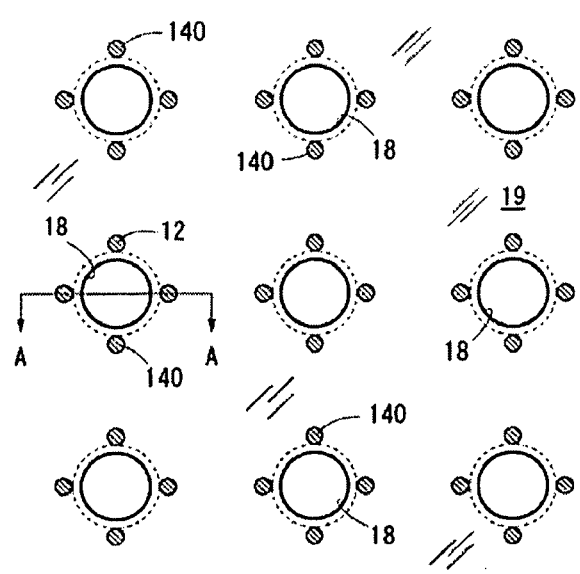
FIG. 3 is a plan view showing an arrangement of the pilot holes and the gas purging holes.

FIG. 3 is a partial plan view of the base member 16, in which the gas purging holes 140 are formed in the surface of the base member 16. The pilot holes 18 penetrating the base member 16 are regularly arranged in a matrix form. Further, four gas purging holes 140 are cruciately arranged around the edge of each of the pilot holes 18. The surfaces of the prepregs 12 are exposed in the gas purging holes 140 as inner bottom faces thereof.

Each of the gas purging holes 140 are separated the distance D from the pilot hole 18. As described above, by separating the gas purging holes 140 from the edges of the pilot holes 18, etching the plated layers 19 coating the inner faces of the pilot holes 18 can be prevented when the copper foils 14 and the plated layers 19 on the base member 16 are etched. The surfaces of the base member 16 are coated with the plated layers 19. Note that, FIG. 2A is a sectional view taken along a line A-A shown in FIG. 3.

The arrangement of the pilot holes 18 bored in the base member 16 is not limited to the matrix form, so they may be arranged optionally. A plurality of the gas purging holes 140 may be provided between the adjacent pilot holes 18, may be radially arranged with respect to each of the pilot holes 18 and may be merely regularly arranged in the surface of the base member 16.

As described above, the gas purging holes 140 are located near the edges of the pilot holes 18 so as to effectively purge the gas and/or water vapor from the parts near the pilot holes 18. If a large number of the gas purging hoes 140 are further formed in the surfaces of the base member 16 other than the parts near the pilot holes 18, the gas and/or water vapor can be easily purged from the core section 10. Further, many asperities, i.e., gas purging holes, are formed in the surfaces of the base member 16, so that bonding strength between the base member 16 and insulating layers, which are formed on the surfaces of the base member 16, can be increased.

Figure 2B:
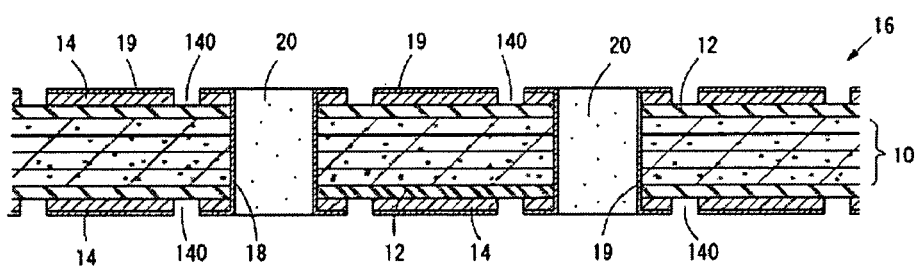

In FIG. 2B, the resin 20 is filled in the pilot holes 18 as insulating materials. The pilot holes 18 can be filled with the resin 20 by screen-printing or using a metal mask.

After filling the pilot holes 18 with the resin 20, the resin 20 is cured by the heating step. In the present embodiment, the resin 20 is thermosetting epoxy resin, and the resin 20 is cured at temperature of about 160° C. Since the gas purging holes 140 are formed in the surfaces of the base member 16, the decomposition gas and/or water vapor generated from the core section 10 can be discharged or purged to the outside via the gas purging holes 140, so that expansion of the plated layers 19 and the copper foils 14 can be prevented.

After heat-curing the resin 20 in the pilot holes 18, ends of the cured resin 20, which are projected outward from the pilot holes 18, are abraded and flattened, so that end faces of the cured resin 20 are made level with the surfaces of the plated layers 19.

Figure 4A:
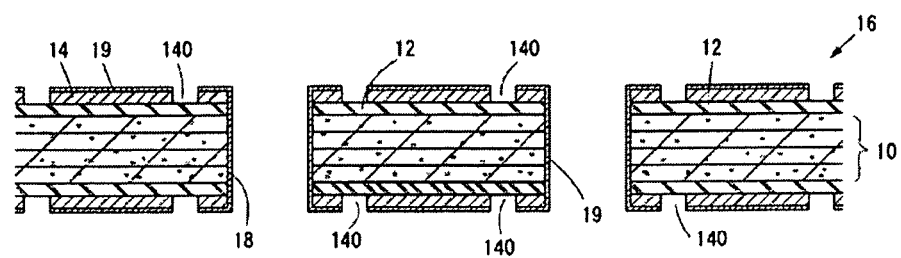
FIGS. 4A-4C are partial sectional views showing another process of producing the gas purging holes and filling the pilot holes with resin.
Figure 4B:
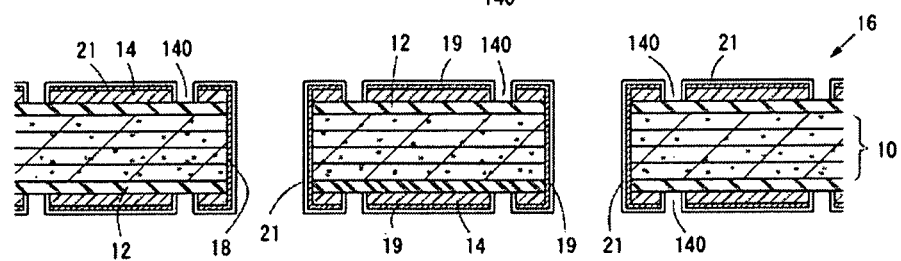

In FIGS. 4A-4B, the inner faces of the pilot holes 18 are coated with the plated layers 19, and then the inner faces of the pilot holes 18 are further coated with insulating films 21.

In FIG. 4A, the pilot holes 18 shown in FIG. 2A are coated with the plated layers 19.

In FIG. 4B, the insulating films 21 are formed on the copper foils 14 and the plated layers 19, which have been formed on the inner faces of the pilot holes 18 and the surfaces of the base member 16, by the electrodeposition method. The plated layers 19 entirely coat the inner faces of the pilot holes 18 and the both side faces of the base member 16. Therefore, the insulating films 21 can be formed on the inner faces of the pilot holes 18 and the entire side faces of the base member 16 by the electrodeposition method, in which the plated layers 19 are used as electric power feeding layers. For example, the insulating films 21 can be electrodeposited by a constant current method, in which the base member is soaked in an electrodeposition solution of epoxy resin and then a direct current is passed through the plated layers 19.

The insulating films 21 are formed to securely prevent short circuit between the pilot holes 18 and the plated through-hole sections.

After electrodepositing the insulating films 21 on the inner faces of the pilot holes 18 and the both side faces of the base member 16, a drying process and a heating process are performed so as to cure the insulating films 21. Thicknesses of the insulating films 21 are 10-20 μm.

Figure 4C:
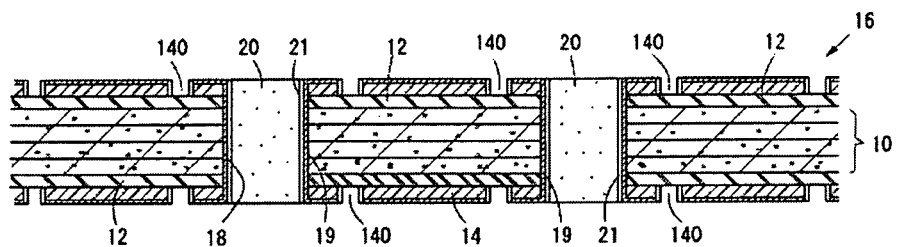

In FIG. 4C, the pilot holes 18, whose inner faces have been coated with the insulating films 21, are filled with the resin 20 as the insulating materials. While heat-curing the resin 20 in the pilot holes 18, the gas generated from the core section and water vapor generated from the base member 16 are discharged to the outside via the gas purging holes 140 formed in the surfaces of the base member 16, so that the problem of expanding the plated layers 19 and the insulating films 21 can be prevented.

After heat-curing the resin 20 in the pilot holes 18, ends of the cured resin 20, which are projected outward from the pilot holes 18, are abraded and flattened. At that time, the insulating films 21 coating the surfaces of the base member 16 are also abraded and removed, and the end faces of the cured resin 20 are made level with the surfaces of the base member 16.

By coating the inner faces of the pilot holes 18 with the plated layers 19, the rough inner faces of the pilot holes 18 can be made smooth, so that no voids are formed in the resin 20 when the pilot holes 18 are filled with the molten resin 20. Therefore, the short circuit between the core section and the plated through-hole sections, which is caused by voids formed in the resin 20, can be effectively prevented. By coating the plated layers 19 with the insulating films 21, the inner faces of the pilot holes 18 are made further smooth, filling rate of the resin 20 can be improved, and the insulating films 21 insulate the pilot holes 18 from the plated through-hole sections so that the short circuit between the core section 10 and the plated thorough-hole sections can be securely prevented.

The core substrate of the present embodiment is produced by: filling the pilot holes 18 bored in the base member 16 with the resin 20 as shown in FIG. 2B or 4C; laminating the cable layers on the both side faces of the base member 16; and forming the plated through-hole sections penetrating the pilot holes 18

A thermal expansion coefficient of the base member 16 having the core section 10 composed of carbon fiber-reinforced plastic is about 1 ppm/° C.; in some cases, a thermal expansion coefficient of the cable layers laminated on the substrate 16 is about 15-30 ppm/° C. If the thermal expansion coefficients of the base member 16 and the cable layers are significantly different, the cable layers will be separated from the base member 16 or cracks will be formed in a boundary surface therebetween.

(Steps of Forming Anchor Patterns)

To solve the problems caused by the heat stresses generated between the base member 16 and the cable layers, in the present embodiment, anchor patterns 15, which work as anchors between the base member 16 and the cable layers laminated on the both side faces of the base member 16, are formed.

FIGS. 5A-5D are partial sectional views showing the steps of forming the anchor patterns 15 on the both side faces of the base member 16.

In FIG. 5A, the base member 16, whose pilot holes 18 have been filled with the resin 20, are electroless-plated with copper.

In FIG. 5B, dry film resist (photo resist) is applied on the both side faces of the base member 16, which has been electroless-plated with copper, and the dry film resist is optically exposed and developed to form resist patterns 74. Each of the resist patterns 74 is constituted by pattern sections 74a for forming lands 142 around edges of the pilot holes 18 and pattern sections 74b for forming the anchor patterns 15.

Each of the pattern sections 74a for forming the lands 142 has a circular planar shape and covers a planar area of the pilot hole 18 and an edge of the pilot hole with a prescribed width. As shown in FIG. 5B, an outer edge part of the pattern section 74a is slightly extended (extended length: W) from the edge of the pilot hole 18. With this structure, invasion of an etching solution to the plated layer 19 coating the inner face of the pilot hole 18 can be prevented while etching the copper foils 14 and the plated layers 19 on the base member 16, so that etching the plated layer 19 coating the inner face of the pilot hole 18 can be prevented.

When the copper foils 14 and the plated layers 19 on the base member 16 are etched with using the resist patterns 72 as masks, side faces of the copper foils 14 and the plated layers 19 are etched in opening parts of the resist patterns. Amount of etching the side face is about 70% of the thickness of the layer to be etched. Therefore, the extended distance W of the resist patterns 72 is set, with considering the amount of etching the side faces, so as to prevent the etching solution from reaching the inner faces of the pilot holes 18. Namely, the plated layers 19 coating the inner faces of the pilot holes 18 are protected. The amount of etching the side faces depends on etching conditions, e.g., thicknesses of the copper foils 14 and the plated layers 19, etching solution, injection pressure of an etching solution, so the extended distance W of the resist patterns 72 must be set on the basis of the conditions.

The pattern sections 74b for forming the anchor patterns 15 may be optionally provided between the pilot holes 18. In the present embodiment, the anchor patterns 15, which are a number of bosses, are evenly spaced.

Since the anchor patterns 15 cannot be formed in the gas purging holes 140 of the base member 16, the anchor patterns 15 are separately formed from the gas purging holes 140.

In FIG. 5C, the copper foils 14 and the plated layers 19 on the both side faces of the base member 16 are etched with using the resist patterns 74 as masks. Exposed parts of the copper foils 14 and the plated layers 19, which are not masked by the resist patterns 74, are etched and removed, so that the base prepregs 12 are exposed.

In FIG. 5D, the resist patterns 74 are dissolved and removed after etching the copper foils 14 and the plated layers 19. The lands 142 and the anchor patterns 15 are formed on the both side faces of the base member 16. The anchor patterns 15 are bosses projected from the surfaces of the base member 16 and evenly spaced.

The lands 142 are formed into rings and surround the pilot holes 18 filled with the resin 20.

In the step shown in FIG. 5A, the surfaces of the base member 16 are electroless-plated with copper. By performing the electroless plating, the resist patterns 74 can be easily removed from the resin 20 after etching the copper foils 14 and the plated layers 19.

The dry film resist is composed of resin, so if the dry film resist is applied on the both side faces of the base member 16 without performing the electroless copper plating, the dry film resist solidly adheres to the resin 20. Therefore, it is very difficult to remove the resist patterns 72 from the resin 20 after etching the copper foils 14 and the plated layers 19.

On the other hand, in the present embodiment, the surfaces of the base member 16 are previously electroless-plated with copper, and then the dry film resist, which will become the resist patterns 72, is applied, so that the resist patterns 72 can be easily removed by a liftoff method or chemically dissolving elecroless-plated copper layers 80. The copper layers 80, which are formed between the end faces of the resin 20 and the resist patterns 72, act as release layers.

Thicknesses of the copper-plated layers 80 may be 0.5-1 μm. The electroless plated layers, which act as the release layers, may be composed of not only copper but also other metals. In the present embodiment, copper is used because copper-plating can be easily performed and copper can be easily etched.

The copper-plated layers 80, which are bases of the resist patterns 74, are removed when the resist patterns 74 are removed.

Figure 6:
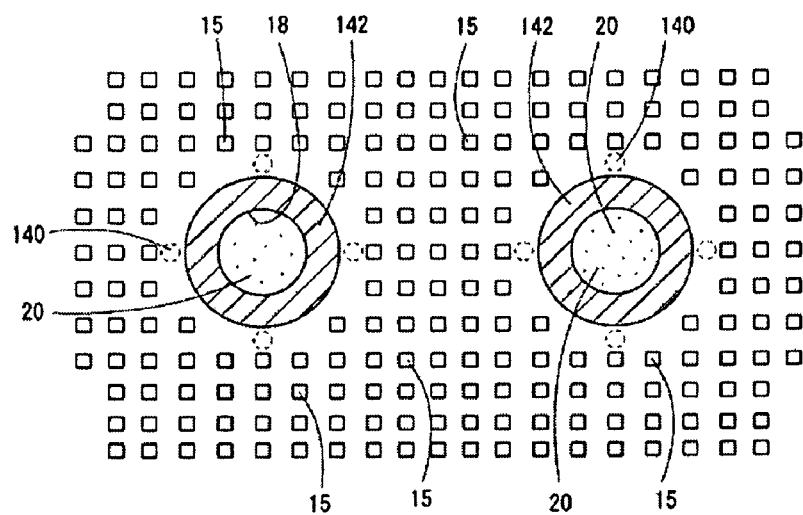
FIG. 6 is a plan view showing an arrangement of lands and the anchor patterns.

FIG. 6 is a plan view showing a planar arrangement of the lands 142 and the anchor patterns 15.

The pilot holes 18 are filled with the resin 20, and the ring-shaped lands 142 surround end faces of the cured resin 20. A number of the anchor patterns 15 are formed between the adjacent lands 142. In the present embodiment, the anchor patterns 15 have square planar shapes, and they are formed into small bosses. The planar shape of the anchor patterns 15 is not limited to the square shape, so other shapes, e.g., circular shape, triangular shape, diamond shape, star shape, may be employed. Further, size, density, etc. of the anchor patterns 15 may be optionally selected.

(Steps of Forming Cable Layers)

FIGS. 7A-8B show the steps of: forming the cable layers on the both side faces of the base member, in which the anchor patterns 15 are formed on the both side faces and the lands 142 are formed along the edges of the pilot holes 18 by the above described steps; and forming the plated through-hole sections.

Figure 7A:
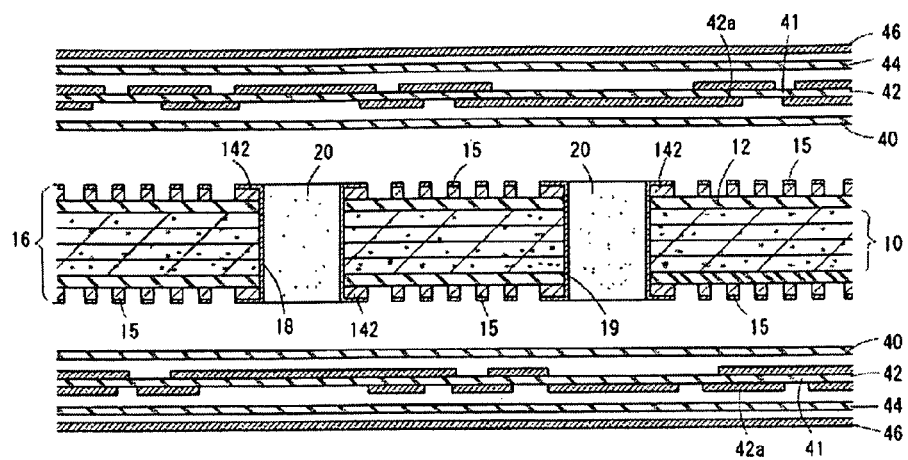
FIGS. 7A-7C are partial sectional views showing the steps of producing a core substrate.

In FIG. 7A, prepregs 40, cable sheets 42, prepregs 44 and copper foils 46 are laminated in this order. Each of the cable sheets 42 is constituted by an insulating resin sheet 41 and cable patterns 42a, which are formed on the both faces of the insulating resin sheet 41. The cable sheet 42 may be formed by etching copper foil layers of a copper-bonded substrate, which is constituted by an insulating resin sheet composed of a glass cloth and copper foils bonded on the both faces of the insulating resin sheet, in prescribed patterns.

Figure 7B:
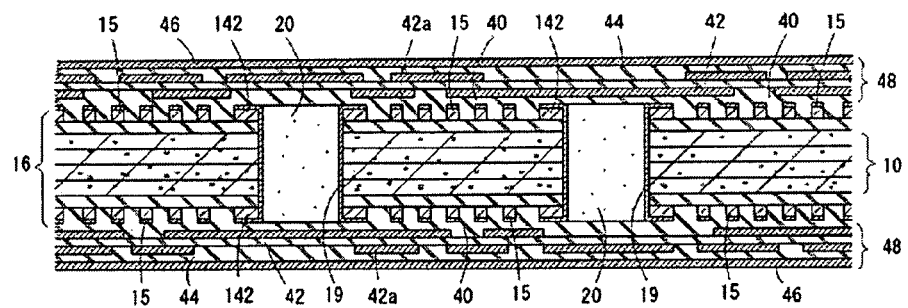

In FIG. 7B, the prepregs 40, the cable sheets 42, the prepregs 44 and the copper foils 46, which have been correctly positioned on the both side faces of the base member 16, are heated and pressurized, so that the prepregs 40 and 44 are cured and cable layers 48 are integrally laminated on the base member 16. The prepregs 40 and 44 are formed by impregnating glass cloths with resin, and the uncured prepregs 40 and 44 are provided between layers. By the heating and pressurizing process, the prepregs 40 and 44 insulate and integrate the cable layers 48.

In the present embodiment, the anchor patterns 15 are formed on the side faces of the base member 16, so the anchor patterns 15 act as anchors when the cable layers 48 are press-bonded onto the base member 16. Therefore, the cable layers 48 can be tightly bonded on and integrated with the base member 16.

Figure 7C:
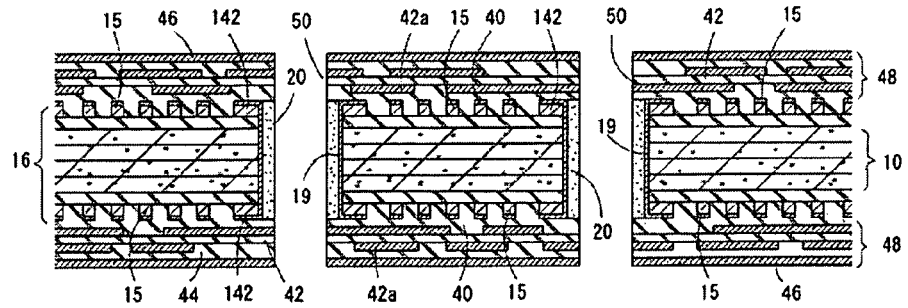

In FIG. 7C, through-holes 50 are bored in the base member 16, on which the cable layers 48 have been laminated, so as to form the plated through-hole sections. The through-holes 50 are coaxial with the pilot holes 18 and bored, by a drill, in the thickness direction of the base member 16, which has been integrated with the cable layers 48. Since diameters of the through-holes 50 are smaller than those of the pilot holes 18, the resin 20 is exposed in the inner faces of the through-holes 50 passing through the resin 20.

Figure 8A:
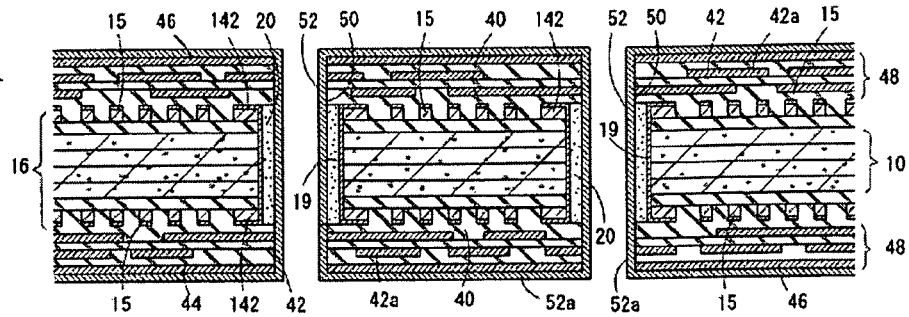
FIGS. 8A and 8B are partial sectional views showing further steps of producing the core substrate.

In FIG. 8A, the base member 16 is plated with copper by an electroless plating method and an electrolytic plating method so as to form the plated through-hole sections 52 on the inner faces of the through-holes 50 after forming the through-holes 50. By performing the electroless plating method, the inner faces of the through-holes 50 and the entire surfaces of the base member 16 are coated with copper. Then, the electrolytic plating method is performed with using the copper layer formed by the electroless plating method as electric power feeding layers, so that the inner faces of the through-holes 50 and the entire surfaces of the base member 16 are coated with plated layers 52a. The plated layers 52a formed on the inner faces of the through-holes 50 acts as the plated through-hole sections 52, which mutually connect cable patterns formed on the both side faces of the base member 16.

Figure 8B:
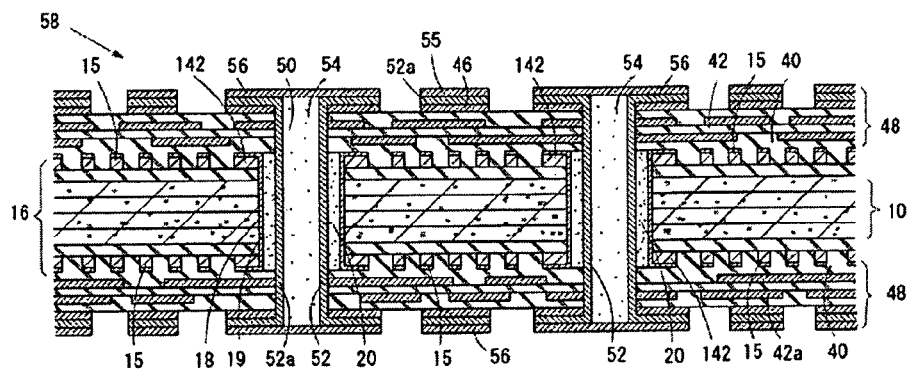

In FIG. 8B, after forming the plated through-hole sections 52, the through-holes 50 are filled with resin 54, cap-plated layers 55 are formed, and then cable patterns 56 are formed by etching the copper foils 46, the plated layers 52a and the cap-plated layers 55, which are formed on the both side faces of the base member, in prescribed patterns, so that the core substrate 58 can be produced.

The cable patterns 56 formed on the both side faces of the core substrate 58 are mutually electrically connected by the plated through-hole sections 52. Further, the inner cable patterns 42a in the cable layers 48 are connected to the plated through-hole sections 52 at suitable positions.

In the core substrate 58, the inner faces of the pilot holes 18, which are formed in the base member 16 including the core section 10, are coated with the plated layers 19, so that the short circuit between the core section 10 and the plated through-hole sections 52 can be prevented.

Figure 9:
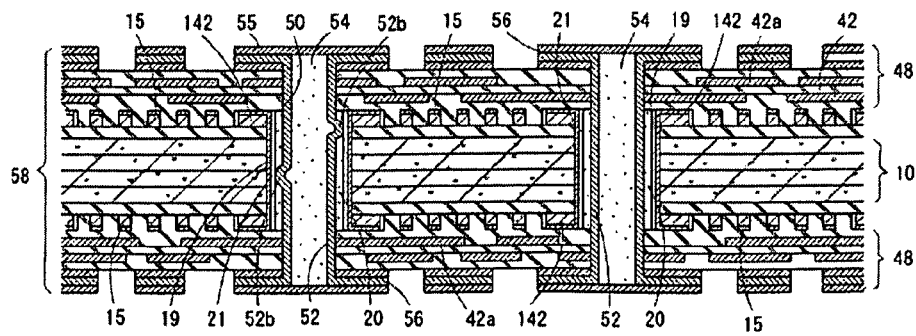
FIG. 9 is a partial sectional view of a modified core substrate.

FIG. 9 shows the core substrate 58 including the base member 16 shown in FIG. 4C, in which the inner faces of the pilot holes 18 are coated with the plated layers 19 and insulating films 21.

In this case too, the core substrate 58 can be produced by laminating the cable layers 48 on the both side faces of the base member 16 as well as the process shown in FIGS. 7A-8B. The cable patterns 56 are formed on the both side faces of the core substrate 58, and the cable patterns 56 are mutually electrically connected by the plated through-hole sections 52.

In the core substrate 58 of the present embodiment, the inner faces of the pilot holes 18 formed in the core section 10 are doubly coated with the plated layers 19 and the insulating films 21, and the insulating films 21 are exposed on the inner faces of the pilot holes 18. Therefore, even if voids are formed in the resin 20 and the voids make expanded parts 52b in the plated through-hole section 52 when the pilot holes 18 are filled with the resin 20, the insulating film 21 exists between the expanded parts 52b and the plated layer 19 so that short circuit between the plated through-hole sections 52 and the core section 10 can be prevented.

By forming the anchor patterns 15 on the both side faces of the base member 16, the cable layers 48 can be tightly bonded on the base member 16. Even if the thermal expansion coefficients of the base member 16 and the cable layer 48 are significantly different, separating the cable layers 48 from the base member 16 and forming cracks in the boundary surface therebetween can be prevented. Therefore, the entire thermal expansion coefficient of the core substrate 58 can be adjusted to a desired value.

(Steps of Producing Circuit Board)

The circuit board can be produced by laminating the cable patterns on the both side faces of the core substrate 58.

Figure 10:
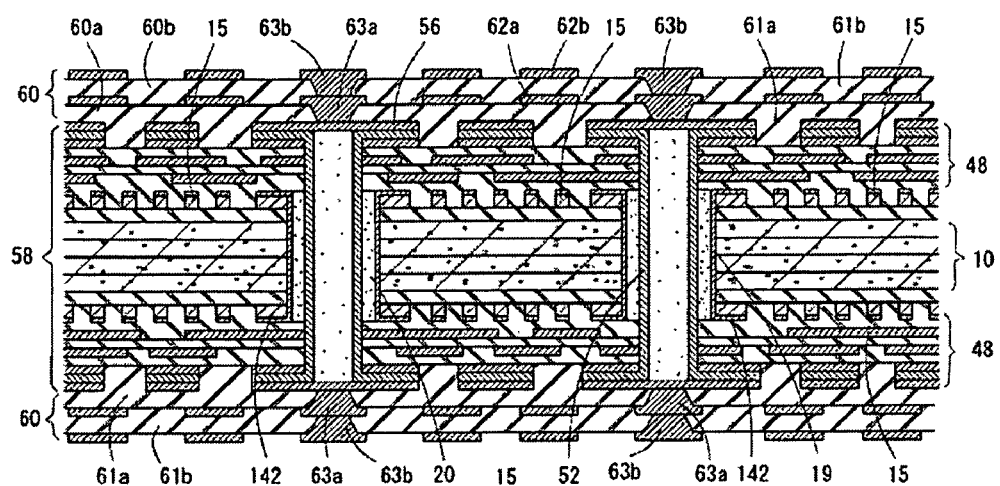
FIG. 10 is a partial sectional view of a circuit board.

In the circuit board shown in FIG. 10, build-up layers 60, each of which is constituted by two build-up layers 60a and 60b, are formed on the both side faces of the core substrate 16 shown in FIG. 8B.

Each of the first build-up layers 60a includes: an insulating layer 61a; a cable pattern 62a formed on a surface of the insulating layer 61a; and vias 63a electrically connecting the lower cable pattern 56 to the upper cable pattern 62a. Each of second build-up layers 60b includes: an insulating layer 61b; a cable pattern 62b; and vias 63b.

The cable patterns 62a and 62b, which are included in the build-up layers 60 formed on the both side faces of the core substrate 58, are mutually electrically connected by the plated through-hole sections 52 and the vias 63a and 63b.

The steps of forming the build-up layers 60 will be explained.

Firstly, insulating layers 61a are formed on the both side faces of the core substrate 58 by laminating insulating resin films, e.g., epoxy film, and via holes, in which the vias 63a will be formed and in which the cable patterns 56 formed on the side faces of the core substrate 58 are exposed, are bored in the insulating layers 61a by laser means.

Next, the inner faces of the via holes are desmear-treated so as to roughen the inner faces thereof, and then the inner faces of the via holes and the surfaces of the insulating layers 61a are coated with copper layers by the electroless plating.

Then, the electroless-plated copper layers are coated with photoresist, and resist patterns, in which parts of the electroless-plated copper layers which will be formed as the cable patterns 62a are exposed, are formed by optically exposing and developing the photoresist.

Further, the electrolytic plating, in which the resist patterns are used as masks and in which the electroless-plated copper layers are used as electric power feeding layers, is performed so as to supply copper to the exposed parts of the electroless-plated copper layers for upraising the copper therein. In this step, the via holes are filled with copper supplied by the electrolytic plating method and the vias 63a are formed.

Next, the resist patterns are removed, and the exposed parts of the electroless-plated copper layers are etched and removed, so that cable patterns 62a are formed, in prescribed patterns, on the surfaces of the insulating layers 61a.

The second build-up layers 60b can be formed as well as the first build-up layers 60a.

Electrodes, to which semiconductor elements will be connected, or connecting pads, to which external connectors will be connected, are patterned in the outermost layers, and the outermost layers other than the exposed parts, e.g., electrodes, connecting pads, are coated with protection films. The exposed electrodes or connecting pads are plated with, for example, gold for protection.

The circuit board may be produced by other methods. The steps of forming the cable layers on the both side faces of the core substrate 58 are not limited to the above described steps.

Note that, in the above described embodiments, the base member has the core section 10 composed of electrically conductive carbon fiber-reinforced plastic. The present invention may be applied to core substrates having core sections composed of nonconductive materials, too. The present invention can be effectively applied to solve the problems of the heat stress, which are caused by the difference of the thermal expansion coefficients between the base member and the cable layers laminated thereon.

The invention may be embodied in other specific forms without departing from the spirit of essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A circuit board, comprising:
   a base member; and
   a cable layer being laminated on the base member with anchor patterns, which are electrically conductive layers formed on a surface of the base member,
   wherein said circuit board is a core substrate having a plated through-hole section, which penetrates the base member and the cable layer in the thickness direction, wherein the base member has an electrically conductive core section; and a pilot hole for forming the plated through-hole section is formed in the core section.

2. The circuit board according to claim 1,
wherein the anchor patterns are a number of bosses projected from the surface of the base member.

3. The circuit board according to claim 1,
wherein an inner face of the pilot hole is coated with a plated layer; and
the pilot hole is filled with an insulating material.

4. The circuit board according to claim 3,
wherein the inner face of the pilot hole is further coated with an insulating film formed on the plated layer.

5. The circuit board according to claim 1,
wherein cable layers are laminated on the core substrate as a multi-layered circuit board.

6. The circuit board according to claim 1,
wherein the core section is composed of carbon fiber-reinforced plastic.

* * * * *